United States Patent
Ting

(10) Patent No.: US 11,031,509 B1
(45) Date of Patent: Jun. 8, 2021

(54) MEMORY DEVICE AND MANUFACTURING METHOD THEREOF

(71) Applicant: MACRONIX International Co., Ltd., Hsinchu (TW)

(72) Inventor: Jung-Chuan Ting, Hsinchu County (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 16/842,788

(22) Filed: Apr. 8, 2020

(51) Int. Cl.
*H01L 29/788* (2006.01)
*H01L 27/11521* (2017.01)
*H01L 29/51* (2006.01)
*H01L 21/306* (2006.01)
*H01L 29/66* (2006.01)
*H01L 21/28* (2006.01)

(52) U.S. Cl.
CPC .... *H01L 29/7883* (2013.01); *H01L 21/30604* (2013.01); *H01L 27/11521* (2013.01); *H01L 29/40114* (2019.08); *H01L 29/517* (2013.01); *H01L 29/66545* (2013.01); *H01L 29/66825* (2013.01)

(58) Field of Classification Search
CPC .......... H01L 29/7883; H01L 29/40114; H01L 29/517
See application file for complete search history.

(56) References Cited

U.S. PATENT DOCUMENTS

| 9,754,938 | B1* | 9/2017 | Feng | ................. H01L 27/0886 |
| 2020/0303394 | A1* | 9/2020 | Hung | ................. H01L 27/11573 |

* cited by examiner

*Primary Examiner* — Errol V Fernandes
(74) *Attorney, Agent, or Firm* — J.C. Patents

(57) ABSTRACT

A memory device including a substrate, a stack structure, an isolation structure, an inter-gate dielectric layer, a control gate, a first insulation structure, a first gate dielectric layer, and a first gate. The stack structure is disposed on the substrate. The isolation structure is disposed in the substrate and disposed at two sides of the stack structure. The inter-gate dielectric layer covers the stack structure and the isolation structure. The control gate covers the inter-gate dielectric layer. The first insulation structure is disposed in the substrate, wherein a top surface of the first insulation structure is lower than a top surface of the substrate, so that a side surface of a portion of the substrate is exposed. The first gate dielectric layer is disposed on the top surface and the side surface of the substrate. The first gate covers the first gate dielectric layer.

9 Claims, 5 Drawing Sheets

MEMORY DEVICE AND MANUFACTURING METHOD THEREOF

BACKGROUND OF THE INVENTION

1. Field of the Invention

The invention relates to a semiconductor device and a manufacturing method thereof, and in particular, to a memory device and a manufacturing method thereof.

2. Description of Related Art

A memory device is an essential component in a digital electronic apparatus. When a processing function of an electronic apparatus is greatly improved, a memory capacity of the memory device thereof also needs to be increased, and a size of the memory device also needs to be reduced. Based on this, in order to meet the foregoing requirements, it has become a trend to integrate an array region of a memory cell and a periphery circuit region including a metal-oxide semiconductor device on a same chip.

However, the memory device undergoes a high-temperature annealing process during manufacturing, which will cause a serious short-channel effect on the metal-oxide-semiconductor device in the periphery circuit region, resulting in current leakage. In order to resolve this problem, a metal-oxide-semiconductor device having a high threshold voltage may be formed, but has a relatively low operating speed. In addition, forming a metal-oxide-semiconductor device with both a low threshold voltage and a high threshold voltage on a chip requires a complicated process, which will increase manufacturing costs of the memory device.

SUMMARY OF THE INVENTION

The invention provides a memory device, and the memory device at a high operating speed may prevent a leakage current from being generated.

A memory device according to an embodiment of the invention includes a substrate, a stack structure, an isolation structure, an inter-gate dielectric layer, a control gate, a first insulation structure, a first gate dielectric layer, and a first gate. The substrate has a first region and a second region, wherein the second region is adjacent to the first region. The stack structure is located in the first region and is disposed on the substrate, wherein the stack structure includes a gate dielectric layer and a floating gate, and the gate dielectric layer is located between the floating gate and the substrate. The isolation structure is located in the first region and is disposed in the substrate and at two sides of the stack structure. The inter-gate dielectric layer is located in the first region and covers the stack structure and the isolation structure. The control gate is located in the first region and covers the inter-gate dielectric layer. The first insulation structure is located in the second region and is disposed in the substrate, wherein a top surface of the first insulation structure is lower than a top surface of the substrate, and a side surface of a portion of the substrate is exposed. The first gate dielectric layer is located in the second region and is disposed on the top surface of the substrate and the side surface of the portion of the substrate. The first gate is located in the second region and covers the first gate dielectric layer.

A memory device according to another embodiment of the invention includes a substrate, a stack structure, an isolation structure, an inter-gate dielectric layer, a control gate, a first insulation structure, a first gate dielectric layer, a first gate, a second insulation structure, a second gate dielectric layer, and a second gate. The substrate has a first region and a second region, wherein the second region is adjacent to the first region. The stack structure is located in the first region and is disposed on the substrate, wherein the stack structure includes a gate dielectric layer and a floating gate, and the gate dielectric layer is located between the floating gate and the substrate. An isolation structure is located in the first region and is disposed in the substrate and at two sides of the stack structure, wherein a top surface of the isolation structure is lower than a top surface of the stack structure. The inter-gate dielectric layer is located in the first region and covers the stack structure and the isolation structure. The control gate is located in the first region and covers the inter-gate dielectric layer. The first insulation structure is located in the second region and is disposed in the substrate, wherein a top surface of the first insulation structure is lower than a top surface of the substrate, and a portion of a side surface of the substrate has a recess above the top surface of the first insulation structure. The first gate dielectric layer is located in the second region and is disposed on the top surface of the substrate and the side surface of the portion of the substrate. The first gate is located in the second region and covers the first gate dielectric layer.

The invention provides a method for manufacturing a memory device, which has a simple process, and the formed memory device at a high operating speed may prevent a leakage current from being generated.

The method for manufacturing the memory device of an embodiment of the invention includes the following steps. First, a substrate having a first region and a second region is provided. A stack structure and an isolation material layer are disposed in the first region, wherein the isolation material layer is disposed at two sides of the stack structure, and a first sacrificial stack structure and a first insulation material layer is disposed in the second region, wherein the first insulation material layer is disposed at two sides of the first sacrificial stack structure. Then, a portion of the isolation material layer is removed to form an isolation structure. Afterwards, a first dielectric layer and a second dielectric layer are sequentially formed on the substrate, wherein the first dielectric layer and the second dielectric layer cover the stack structure and the isolation structure. Then a portion of the first insulation material layer is removed to form a first insulation structure and expose a side surface of a portion of the substrate. The first sacrificial stack structure is removed, and a top surface of a portion of the substrate is exposed. Then a first gate dielectric layer is formed on the side surface of the substrate and the top surface of the substrate. A third dielectric layer is formed on the substrate, wherein the third dielectric layer covers the second dielectric layer. Finally, a control gate and a first gate are formed on the substrate, wherein the control gate covers the third dielectric layer, and the first gate covers the first gate dielectric layer.

Based on the above, the memory device of the invention exposes the side surface of the substrate through causing the top surface of the first insulation structure located in the second region (a periphery circuit region) to be lower than the top surface of the substrate. Therefore, the first gate formed on the substrate could cover the top surface of the substrate and the side surface of the substrate, so that the first gate may control a channel layer on three sides to reduce a threshold voltage, and the leakage current of a first transistor may be accordingly prevented from being generated.

To make the features and advantages of the invention clear and easy to understand, the following gives a detailed description of embodiments with reference to accompanying drawings.

DESCRIPTION OF THE EMBODIMENTS

FIG. 1A to FIG. 1J are each a schematic diagram of a method for manufacturing a memory device according to an embodiment of the invention.

Figure 1A:
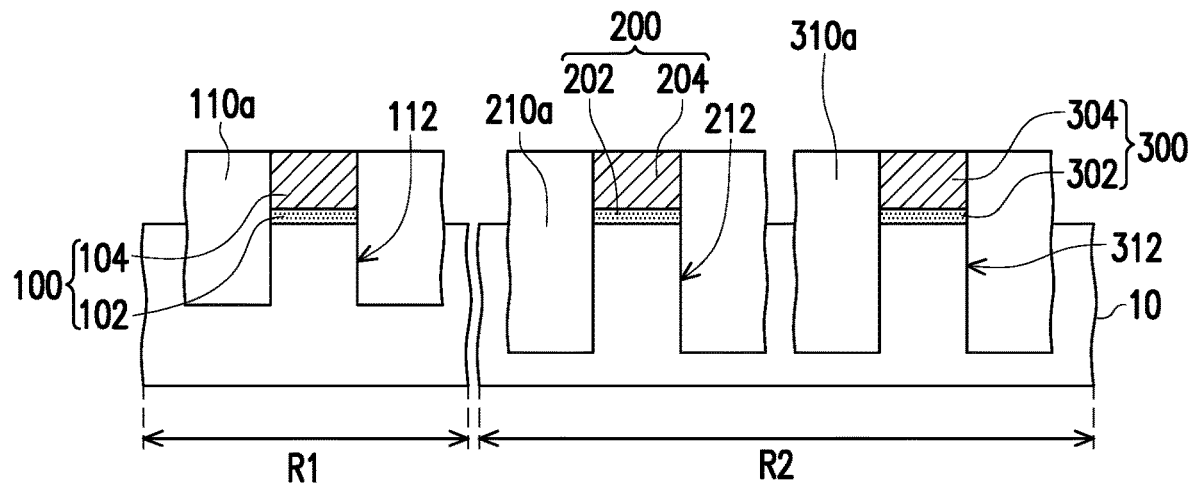
FIG. 1A to FIG. 1J are each a schematic diagram of a method for manufacturing a memory device according to an embodiment of the invention.

Referring to FIG. 1A, a substrate 10 is first provided. The substrate 10 may include a first region R1 and a second region R2, wherein the second region R2 is disposed around the first region R1. The substrate 10 is, for example, a semiconductor substrate, a semiconductor compound substrate, or a semiconductor over insulator (SOI) on a dielectric layer, which is not limited in the invention. The foregoing semiconductor is, for example, an atom of a group IVA, such as silicon or germanium. The foregoing semiconductor compound is, for example, a semiconductor compound such as silicon carbide or germanium silicide formed of atoms of the group IVA, or a semiconductor compound such as gallium arsenide formed of atoms of a group IIIA and a group VA.

Still referring to FIG. 1A, a plurality of stack structures are then formed on the substrate 10. Specifically, a stack structure 100 is formed in the first region R1 of the substrate 10, and a first sacrificial stack structure 200 and a second sacrificial stack structure 300 are formed in the second region R2 of the substrate 10. In the present embodiment, the stack structure 100 includes a tunnel dielectric layer 102 and a floating gate 104, wherein the tunnel dielectric layer 102 and the floating gate 104 are sequentially stacked on a top surface of the substrate 10. The tunnel dielectric layer 102 may comprise a material such as silicon oxide, silicon nitride, or a combination thereof, and the floating gate 104 may comprise a material such as doped polysilicon, undoped polysilicon, or a combination thereof. In addition, in the present embodiment, the first sacrificial stack structure 200 includes a first sacrificial dielectric layer 202 and a first sacrificial conductive layer 204, and the second sacrificial stack structure 300 includes a second sacrificial dielectric layer 302 and a second sacrificial conductive layer 304. The first sacrificial dielectric layer 202 and the first sacrificial conductive layer 204 are sequentially stacked on the top surface of the substrate 10, and the second sacrificial dielectric layer 302 and the second sacrificial conductive layer 304 are also sequentially stacked on the top surface of the substrate 10. The first sacrificial dielectric layer 202 and the second sacrificial dielectric layer 302 may comprise materials such as silicon oxide, silicon nitride, or a combination thereof, and the first sacrificial conductive layer 204 and the second sacrificial conductive layer 304 may comprise materials such as doped polysilicon, undoped polysilicon, or a combination thereof. In some embodiments, a plurality of the stack structures 100 may be disposed in the first region R1, and a plurality of the first sacrificial stack structures 200 and the second sacrificial stack structures 300 may be disposed in the second region R2. The first sacrificial stack structure 200 and the second sacrificial stack structure 300 are, for example, randomly distributed in the second region R2, which is not particularly limited in the invention. In some embodiments, a thickness of the tunnel dielectric layer 102, a thickness of the first sacrificial dielectric layer 202, and a thickness of the second sacrificial dielectric layer 302 are in a range of 4.5 nm to 13.5 nm. In addition, in some embodiments, a thickness of the floating gate 104, a thickness of the first sacrificial conductive layer 204, and a thickness of the second sacrificial conductive layer 304 are in a range of 45 nm to 135 nm. An embodiment of a method for forming the stack structure 100, the first sacrificial stack structure 200, and the second sacrificial stack structure 300 will be described below, but it should be noted that the invention is not limited thereto.

First, a patterned photoresist layer (not shown) is formed on the substrate 10. Next, an etching process is performed on the substrate 10 by using the patterned photoresist layer used as a mask, to form a first trench 112 in the first region R1 and a second trench 212 and a third trench 312 in the second region R2. Then, an isolation material structure (not shown) is formed on the substrate 10, wherein the isolation material structure fills in the first trench 112, the second trench 212 and the third trench 312. Afterwards, a planarization process is performed to remove a portion of the isolation material structure and to form an isolation material layer 110a in the first region R1 of the substrate 10 and a first insulation material layer 210a and a second insulation material layer 310a in the second region R2 of the substrate 10. The top surface of the isolation material layer 110a, the top surface of the first insulation material layer 210a and the top surface of the second insulation material layer 310a are each higher than the top surface of the substrate 10. The isolation material layer 110a, the first insulation material layer 210a, and the second insulation material layer 310a may comprise materials such as silicon oxide, or other suitable dielectric materials. In some embodiments, a depth of the first insulation material layer 210a from the top surface of the substrate 10 and a depth of the second insulation material layer 310a from the top surface of the substrate 10 may be greater than a depth of the isolation material layer 110a from the top surface of the substrate 10 to improve electrical performance of the memory device, but the invention is not limited thereto. In some embodiments, the depth of the first insulation material layer 210a and the depth of the second insulation material layer 310a are in a range of 150 nm to 450 nm, and the depth of the isolation material layer 110a is in a range of 100 nm to 300 nm.

Next, a thermal oxidation process is performed on the substrate 10 to form a tunnel dielectric layer 102 in the first region R1, and a first sacrificial dielectric layer 202 and a second sacrificial dielectric layer 302 in the second region R2. In detail, the tunnel dielectric layer 102 is formed by performing the thermal oxidation process on a portion of the substrate 10 exposed by the isolation material layer 110a in the first region R1, the first sacrificial dielectric layer 202 is formed by performing the thermal oxidation process on a portion of the substrate 10 exposed by the first insulation material layer 210a in the second region R2, and the second sacrificial dielectric layer 302 is formed by performing the thermal oxidation process on a portion of the substrate 10 exposed by the second insulation material layer 310a in the second region R2. Afterwards, a conductive material layer (not shown) may be comprehensively formed on the substrate 10 by using a physical vapor deposition method or a chemical vapor deposition method. Next, a planarization process is performed to remove a portion of the conductive material layer and to form a floating gate 104 in a first region R1, and a first sacrificial conductive layer 204 and a second sacrificial conductive layer 304 in a second region R2. The top surface of the floating gate 104, the top surface of the first sacrificial conductive layer 204, the top surface of the second sacrificial conductive layer 304, the top surface of the isolation material layer 110a, the top surface of the first insulation material layer 210a and the top surface of the second insulation material layer 310a are substantially at the same level. Accordingly, the stack structure 100, the first sacrificial stack structure 200, and the second sacrificial stack structure 300 have been completed.

Still referring to FIG. 1A, in an embodiment, the isolation material layer 110a is disposed at two sides of the stack structure 100, the first insulation material layer 210a is disposed at two sides of the first sacrificial stack structure 200, and the second insulation material layer 310a is disposed at two sides of the second sacrificial stack structure 300.

Figure 1B:
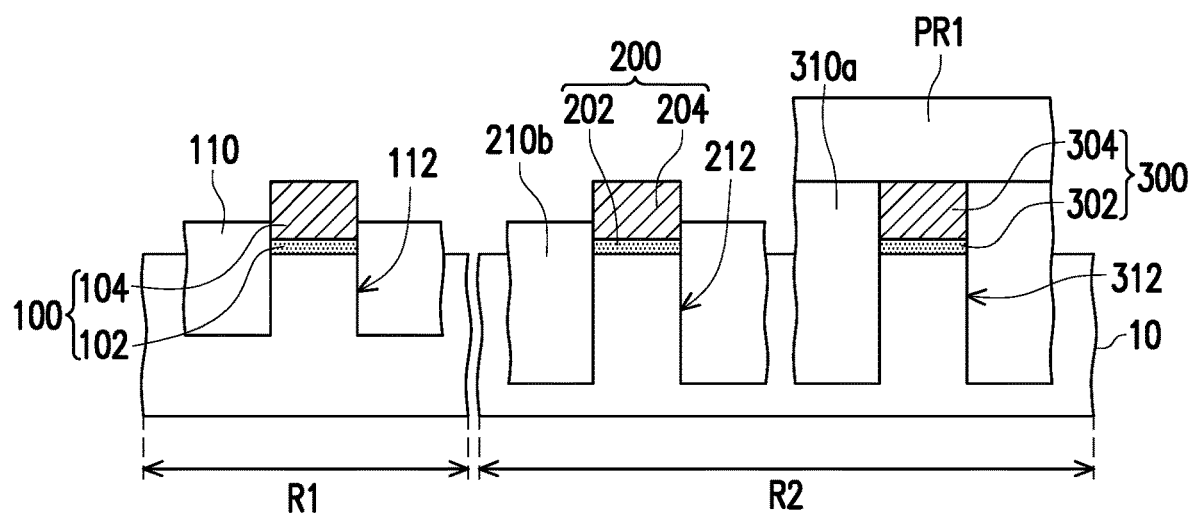

Referring to FIG. 1B, a portion of the isolation material layer 110a is removed to form an isolation structure 110. In addition, it is to be noted herein that a portion of the first insulation material layer 210a of the present embodiment is also removed to form the first insulation material layer 210b. In some embodiments, a patterning process may be performed to remove a portion of the isolation material layer 110a and a portion of the first insulation material layer 210a. In detail, in the present embodiment, a patterned photoresist layer PR1 covering the top surfaces of the second sacrificial stack structure 300 and the second insulation material layer 310a is first formed. Next, the patterned photoresist layer PR1, the floating gate 104, and the first sacrificial conductive layer 204 are used as the mask, and an etching process is performed to remove a portion of the isolation material layer 110a and a portion of the first insulation material layer 210a. In some embodiments, the foregoing etching process may include a wet etching process, a dry etching process, or a combination thereof. In the present embodiment, the wet etching process is adopted, but the invention is not limited thereto. An etching solution such as buffered hydrofluoric acid, diluted hydrofluoric acid, or a combination thereof is, for example, used in wet etching process, and the etching solution has high etching selectivity for the isolation material (that is, the isolation material layer 110a and the first insulation material layer 210a) to the patterned photoresist layer PR1, the floating gate 104, and the first sacrificial conductive layer 204. The top surface of the etched isolation structure 110 and the top surface of the etched first insulation material layer 210b are, each lower than the top surface of the stack structure 100 and the top surface of the first sacrificial stack structure 200, and each exposes a side surface of the floating gate 104 and a side surface of the first sacrificial conductive layer 204.

Figure 1C:
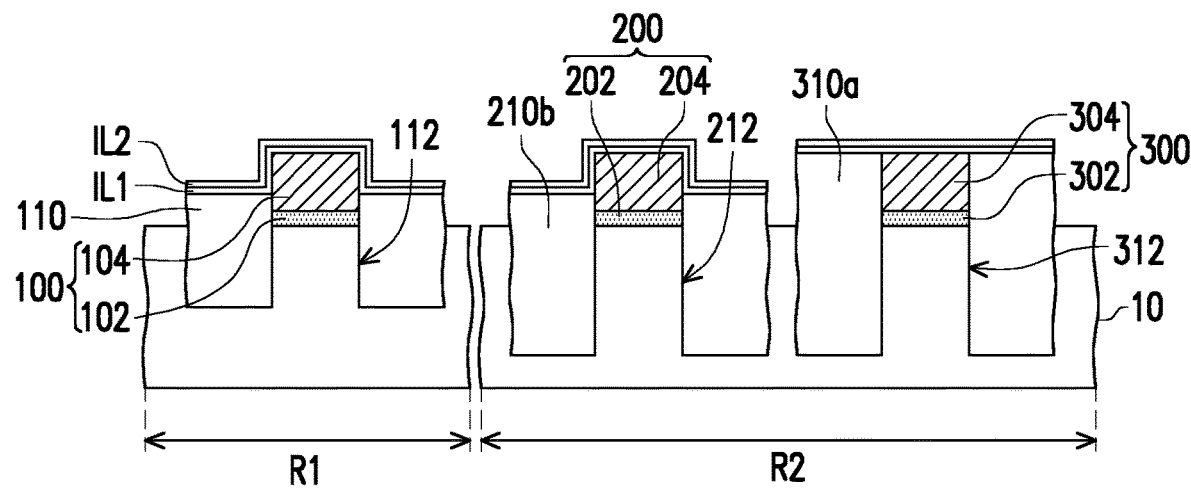

Referring to FIG. 1C, a first dielectric material layer IL1 and a second dielectric material layer IL2 are sequentially formed on the substrate 10. The first dielectric material layer IL1 and the second dielectric material layer IL2 may conformally cover the top surface and a portion of the side surface of the floating gate 104, the isolation structure 110, the top surface and a portion of the side surface of the first sacrificial conductive layer 204, the first insulation material layer 210b, the second sacrificial conductive layer 304, and the second insulation material layer 310a. In some embodiments, the first dielectric material layer IL1 comprises silicon oxide, and the second dielectric material layer IL2 comprises silicon nitride. The method for forming the first dielectric material layer IL1 and the second dielectric material layer IL2 may be formed by a chemical vapor deposition method. In some embodiments, the first dielectric material layer IL1 has a thickness in a range of 2 nm to 6 nm, and he second dielectric material layer IL2 has a thickness in a range of 5 nm to 15 nm.

Figure 1D:
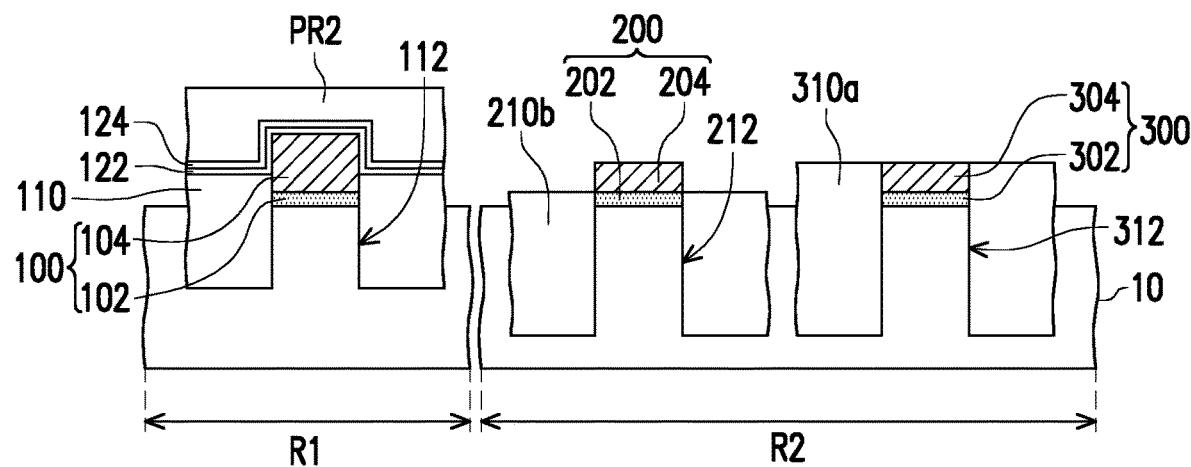

Referring to FIG. 1D, the first dielectric material layer IL1 and the second dielectric material layer IL2 located in the second region R2 are removed to form a first dielectric layer 122 and a second dielectric layer 124 in the first region R1. In some embodiments, the first dielectric material layer IL1 and the second dielectric material layer IL2 that are located in the second region R2 may be removed by performing a patterning process. In detail, in the present embodiment, a patterned photoresist layer PR2 covering the stack structure 100 and the isolation structure 110 is first formed in the first region R1. Next, the patterned photoresist layer PR2 is used as a mask, and an etching process is performed to remove the first dielectric material layer IL1 and the second dielectric material layer IL2 that are located in the second region R2. In some embodiments, the foregoing etching process is, for example, a reactive etching process. Then the patterned photoresist layer PR2 may be removed. It should be noted that, in the present embodiment, after the first dielectric material layer IL1 and the second dielectric material layer IL2 located in the second region R2 are removed, a portion of the first sacrificial conductive layer 204, a portion of the second sacrificial conductive layer 304, a portion of the first insulation material layer 210b, and a portion of the second insulation material layer 310a may be removed due to over-etching.

Figure 1E:
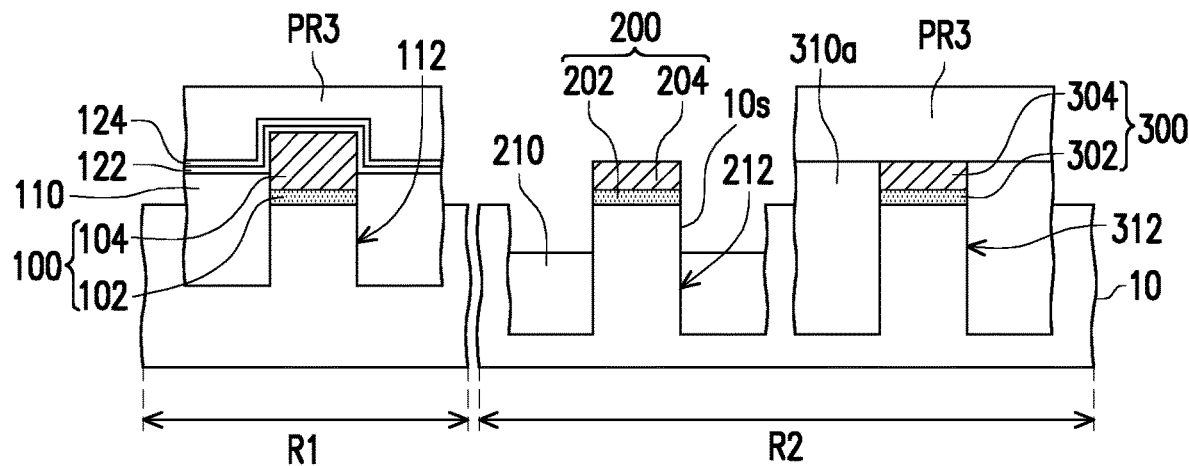

Referring to FIG. 1E, a portion of the first insulation material layer 210b is removed to form a first insulation structure 210 and expose a side surface 10s of a portion of the substrate 10. In some embodiments, a patterning and an etching process may be performed to remove a portion of the first insulation material layer 210b. In detail, in the present embodiment, a patterned photoresist layer PR3 covering the second dielectric layer 124, the second sacrificial conductive layer 304, and the second insulation material layer 310a is first formed. Next, an etching process is performed to remove a portion of the first insulation material layer 210b. In some embodiments, the foregoing etching process may include a wet etching process, a dry etching process, or a combination thereof. In the present embodiment, the wet etching process is adopted. An etching solution such as buffered hydrofluoric acid, diluted hydrofluoric acid, or a combination thereof is, used in wet etching process, and the etching solution has high etching selectivity for the isolation material (that is, the first insulation material layer 210b) to the patterned photoresist layer PR3, and the first sacrificial conductive layer 204. The top surface of the formed first insulation structure 210 may be lower than the top surface of the substrate 10, and therefore the side surface 10s of a portion of the substrate 10 is exposed.

Figure 1F:
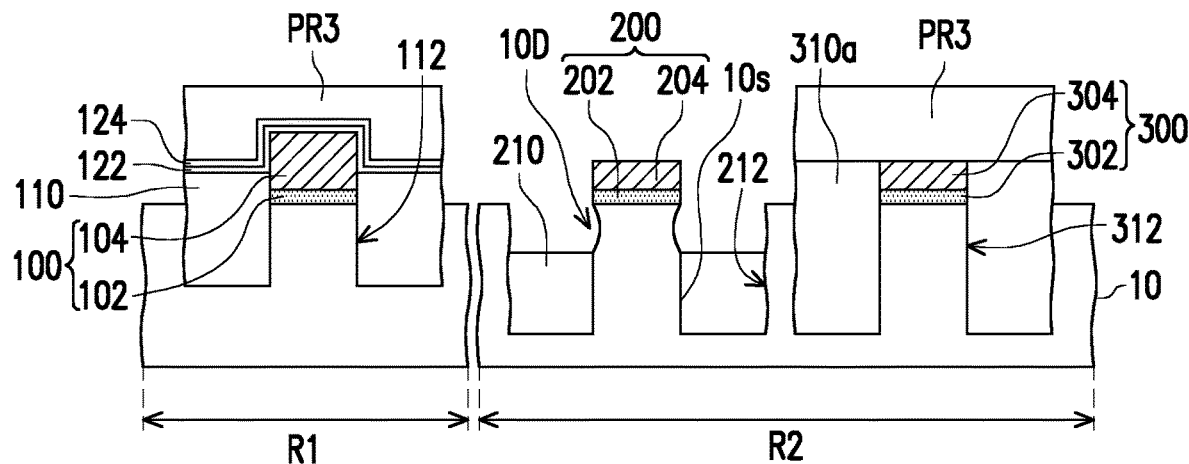

Referring to FIG. 1F, the side surface 10s of the exposed substrate 10 is laterally etched to form a recess 10D in the side surface 10s of the substrate 10. The recess 10D is on a top portion of the side surface 10s of the substrate 10. In detail, in the present embodiment, the first sacrificial conductive layer 204, and the first sacrificial dielectric layer 202 are used as a mask on the substrate 10, and a wet etching process is performed to remove a portion of the substrate 10 under the first sacrificial stack structure 200. A standard cleaner 1 (SC1) or a diluted standard cleaner 1 as an etching solution is, for example, used in wet etching process, wherein the etching solution includes hydrogen peroxide, ammonium hydroxide, and deionized water. After the recess 10D is formed in the side surface 10s of the substrate 10 under the first sacrificial stack structure 200, the patterned photoresist layer PR3 may be removed.

Figure 1G:
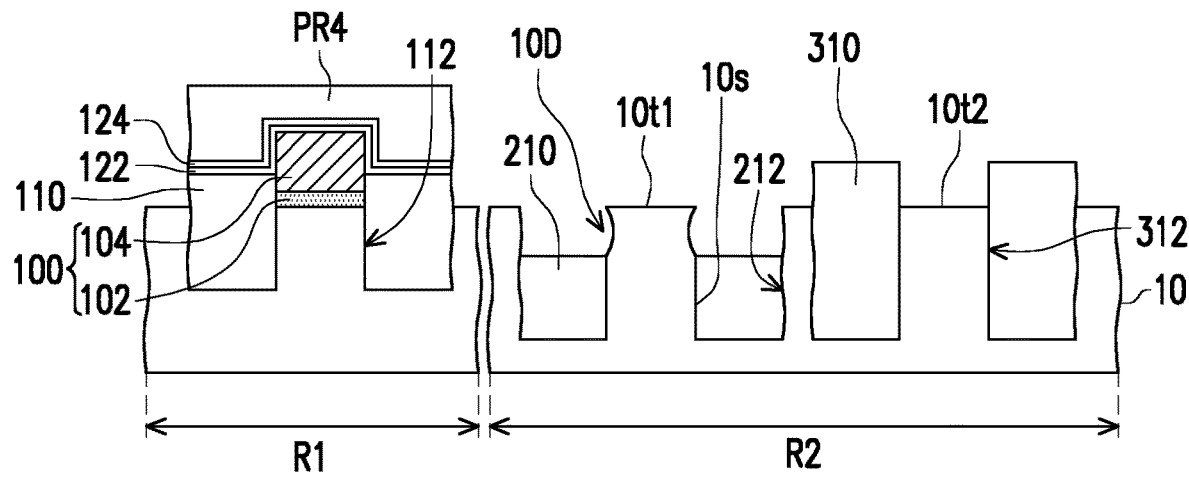

Referring to FIG. 1G, the first sacrificial conductive layer 204, the second sacrificial conductive layer 304, the first sacrificial dielectric layer 202, and the second sacrificial dielectric layer 302 are removed, and top surfaces 10t1 and 10t2 of a portion of the substrate 10 are exposed. Top surfaces 10t1 and 10t2 of a portion of the substrate 10 in region 2 is lower than a top surface of stack structure 100. In some embodiments, a patterning process may be performed to remove the first sacrificial conductive layer 204, the second sacrificial conductive layer 304, the first sacrificial dielectric layer 202, and the second sacrificial dielectric layer 302 that are located in the second region R2. In detail, in the present embodiment, a patterned photoresist layer PR4 covering a top surface of the second dielectric layer 124 is first formed in the first region R1. Then, the patterned photoresist layer PR4 is used as a mask, and an etching process is performed to remove the first sacrificial conductive layer 204, the second sacrificial conductive layer 304, the first sacrificial dielectric layer 202, and the second sacrificial dielectric layer 302 that are located in the second region R2 and expose top surfaces 10t1 and 10t2 of the portion of the substrate 10. In some embodiments, the foregoing etching process is, for example, a reactive etching process. Then, the patterned photoresist layer PR4 is removed. It should be noted that, in the present embodiment, after the first sacrificial conductive layer 204, the second sacrificial conductive layer 304, the first sacrificial dielectric layer 202, and the second sacrificial dielectric layer 302 located in the second region R2 are removed, a portion of the first insulation structure 210 may be removed. Also, a portion of the second insulation material layer 310a located in the second region R2 may be removed due to over-etching, and the second insulation structure 310 is formed.

Figure 1H:
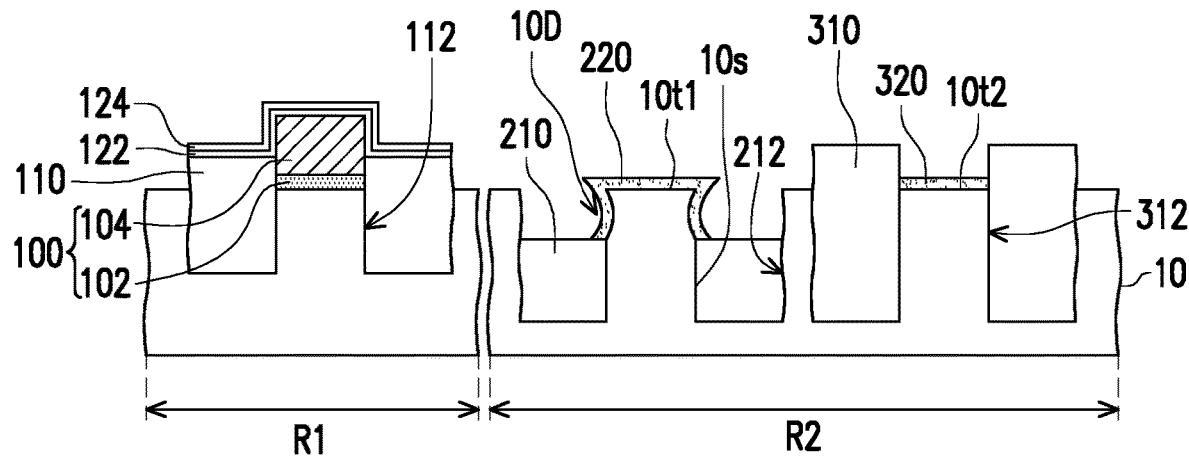

Referring to FIG. 1H, a first gate dielectric layer 220 and a second gate dielectric layer 320 are formed on the exposed substrate 10. In detail, in the present embodiment, a thermal oxidation process is performed on the substrate 10, to form a conformal first gate dielectric layer 220 on a side surface of the recess 10D of the substrate 10 and the top surface 10t1 of the substrate 10, and form a conformal second gate dielectric layer 320 on the top surface 10t2 of the substrate 10. In some embodiments, the first gate dielectric layer 220 and the second gate dielectric layer 320 may comprise silicon oxide. In some other embodiments, the first gate dielectric layer 220 and the second gate dielectric layer 320 may comprise high-dielectric-constant materials comprise such as $HfO_2$, $ZrO_2$, or a combination thereof. In some embodiments, a thickness of the first gate dielectric layer 220 and a thickness of the second gate dielectric layer 320 may be in a range of 10 nm to 20 nm. In some other embodiments, a thickness of the first gate dielectric layer 220 and a thickness of the second gate dielectric layer 320 may be in a range of 2 nm to 4 nm, which may depend on the requirement of the memory device.

Figure 1I:
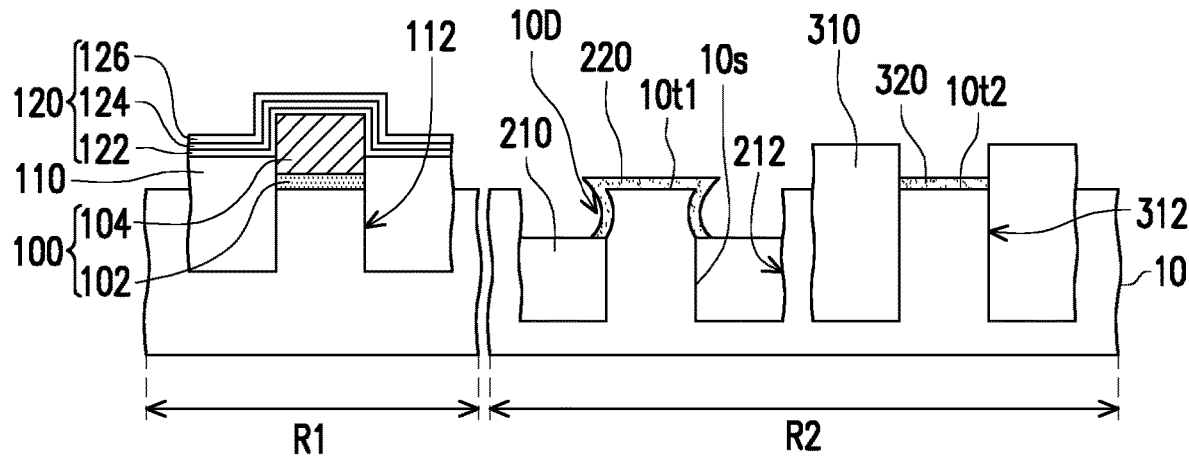

Referring to FIG. 1I, a third dielectric layer 126 is formed on the substrate 10, wherein the third dielectric layer 126 covers the second dielectric layer 124 in the first region R1. In detail, the third dielectric layer 126 may conformally cover the second dielectric layer 124. In some embodiments, the third dielectric layer 126 comprises silicon oxide. The method for forming the third dielectric layer 126 may be formed through in-situ steam generation (ISSG) or other oxidation processes. The foregoing in-situ steam generation is, for example, converting nitride in the second dielectric layer 124 into oxide for the third dielectric layer 126. In some embodiments, the third dielectric layer 126 has a thickness in a range of 3 nm to 7 nm.

Figure 1J:
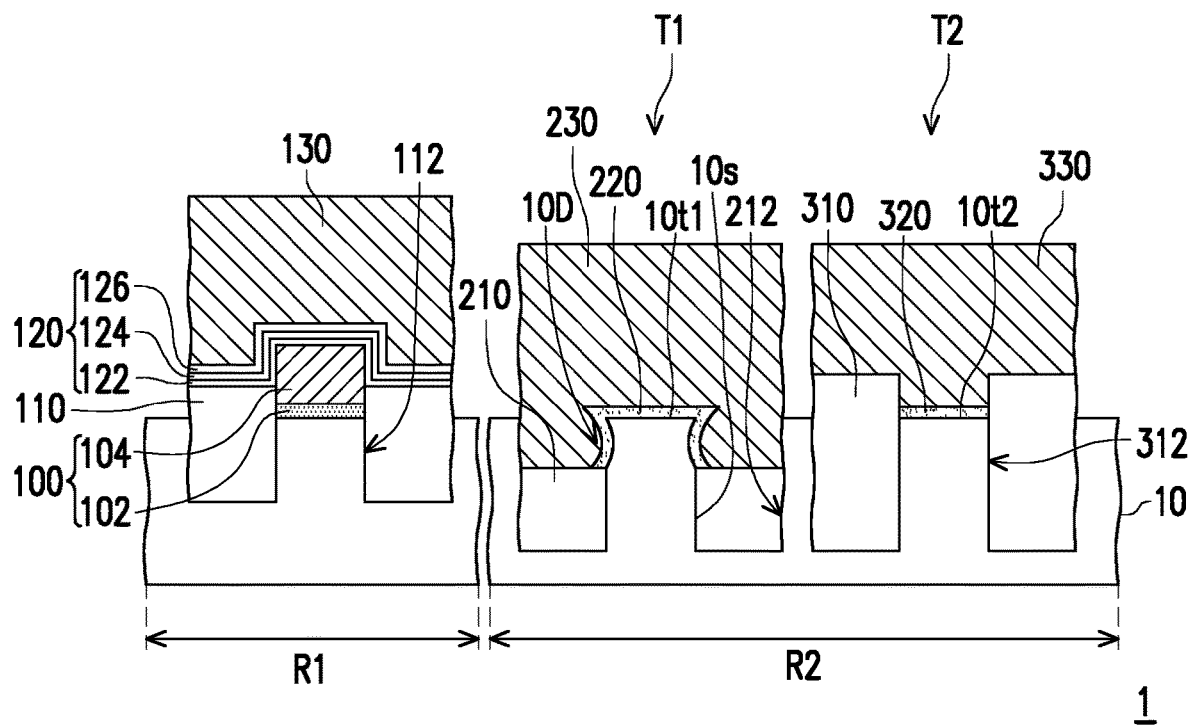

Referring to FIG. 1J, a control gate 130, a first gate 230, and a second gate 330 are formed on a substrate 10. In detail, in the present embodiment, a series of process methods (e.g. physical vapor deposition method or chemical vapor deposition method, lithography patterning method, and etching method) may be performed to form the control gate 130, the first gate 230, and the second gate 330 on the substrate 10, wherein the control gate 130 is located in the first region R1 and covers a third dielectric layer 126, the first gate 230 is located in the second region R2 and covers the first gate dielectric layer 220, and the second gate 330 is located in the second region R2 and covers the second gate dielectric layer 320. In some embodiments, the control gate 130, the first gate 230, and the second gate 330 may comprise doped polysilicon, undoped polysilicon, or a combination thereof. In some other embodiments, the control gate 130, the first gate 230, and the second gate 330 may comprise metal, metal nitride, or other suitable materials, which may comprise Ti, W, TiN, TaN, TiSiN, Mo, MoN, MoSiN, HfN, HfSi, or a combination thereof. In some embodiments, a thickness of the control gate 130, a thickness of the first gate 230, and a thickness of the second gate 330 may be in a range of 150 nm to 250 nm, but the invention is not limited thereto.

Accordingly, a memory device 1 of the invention is manufactured.

Although the method for manufacturing the memory device 1 in the present embodiment is described using the foregoing method as an example, the method for forming the memory device 1 in the invention is not limited thereto.

Still referring to FIG. 1J, FIG. 1J is a partial schematic diagram of a memory device 1 according to an embodiment of the invention. The memory device 1 of the embodiment of the invention includes a substrate 10, a stack structure 100, an isolation structure 110, an inter-gate dielectric layer 120, a control gate 130, a first insulation structure 210, a first gate dielectric layer 220, and a first gate 230, a second insulation structure 310, a second gate dielectric layer 320, and a second gate 330.

The substrate 10 has a first region R1 and a second region R2, wherein the second region R2 is disposed adjacent to the first region R1. In the present embodiment, the first region R1 includes an array of a plurality of memory cells, and the second region R2 includes a plurality of periphery devices for circuitry control. In other embodiments, the first region R1 may be a dense region of the device, and the second region R2 may be a periphery region of the device. In detail, in other embodiments, the quantity of devices in a unit area of the first region R1 may be greater than the quantity of devices in a unit area of the second region R2.

The stack structure 100 is located in the first region R1, and includes a tunnel dielectric layer 102 and a floating gate 104, wherein the tunnel dielectric layer 102 and the floating gate 104 are sequentially stacked on a top surface of the substrate 10, that is, the tunnel dielectric layer 102 is located between the floating gate 104 and the substrate 10. In some embodiments, a plurality of stack structures 100 are disposed.

The isolation structure 110 is located in the first region R1 and is disposed at two sides of the stack structure 100. In the present embodiment, the isolation structure 110 is a shallow trench isolation (STI) structure. A top surface of the isolation structure 110 may be lower than a top surface of the stack structure 100, and a top surface of the isolation structure 110 may be higher than a top surface of the substrate 10, but the invention is not limited thereto.

The inter-gate dielectric layer 120 is located in the first region R1, disposed on the substrate 10, and covers the stack structure 100 and the isolation structure 110. In the present embodiment, the inter-gate dielectric layer 120 is conformally formed on the substrate 10. In some embodiments, the inter-gate dielectric layer 120 includes a multilayer structure. In the present embodiment, the inter-gate dielectric layer 120 includes a three-layer structure composed of a first dielectric layer 122, a second dielectric layer 124, and a third dielectric layer 126. The first dielectric layer 122, the second dielectric layer 124, and the third dielectric layer 126 are sequentially stacked on the top surfaces of the stack structure 100 and the isolation structure 110. The inter-gate dielectric layer 120 may comprise an oxide, a nitride, or a combination thereof. For example, the inter-gate dielectric layer 120 may include a composite layer comprises a silicon oxide layer and a silicon nitride layer. In the present embodiment, the first dielectric layer 122 is made of silicon oxide, the second dielectric layer 124 is made of silicon nitride, and the third dielectric layer 126 is made of silicon oxide. Therefore, inter-gate dielectric layer 120 is a composite layer including oxide-nitride-oxide (ONO). Since Top surfaces 10t1 and 10t2 of a portion of the substrate 10 in the second region R2 is lower than the top surface of stack structure 100 in the first region R1, a top surface of the first gate dielectric layer 220 and the second gate dielectric layer 320 (in second region R2) is lower than a top surface of the inter-gate dielectric layer 120 (in first region R1).

The control gate 130 is located in the first region R1, disposed on the substrate 10, and covers the inter-gate dielectric layer 120. In the present embodiment, since the top surface of the isolation structure 110 is lower than the top surface of the stack structure 100 (that is, a top surface of the floating gate 104) and the inter-gate dielectric layer 120 is conformally formed on the substrate 10, a coupling area between the control gate 130 and the floating gate 104 is increased, thereby increasing a coupling rate between the control gate 130 and the floating gate 104, so that the memory device 1 of the present embodiment has better performance.

The first insulation structure 210 is located in the second region R2 and is disposed in the substrate 10. In the present embodiment, the first insulation structure 210 is a shallow trench isolation structure. In addition, in the present embodiment, the top surface of the first insulation structure 210 is lower than the top surface 10t1 of the substrate 10, and the side surface 10s of the substrate 10 is exposed, wherein the side surface 10s of the substrate 10 has a recess 10D.

The first gate dielectric layer 220 is formed on the side surface 10s of the substrate 10 and the top surface 10t1 of the substrate 10. In the present embodiment, the first gate dielectric layer 220 is conformally formed on the side surface 10s of the substrate 10 and the top surface 10t1 of the substrate 10.

The first gate 230 is, located in the second region R2, disposed on the substrate 10, and covers the first gate dielectric layer 220. In addition, in addition to the first gate dielectric layer 220, the first gate 230 further covers the first insulation structure 210.

In some embodiments, opposite sides of the first gate 230 may be provided with a first source region (not shown) and a first drain region (not shown), respectively. The first gate dielectric layer 220, the first gate 230, a portion of the substrate 10 (a channel layer), the first source region, and the first drain region may form a first transistor T1 of the present embodiment Since the top surface of the first insulation structure 210 of the present embodiment is lower than the top surface 10t1 of the substrate 10, and the side surface 10s of the substrate 10 is exposed, the first gate 230 formed on the substrate 10 could cover the top surface 10t1 of the substrate 10 and the side surface 10s of the substrate 10, so that the first gate 230 may control the channel layer on three sides to reduce a threshold voltage, and a leakage current of the first transistor T1 may be accordingly prevented from being generated. In addition, a width of the channel layer in the present embodiment is a two times of the height of the side surface 10s of the substrate 10 plus the width of the top surface 10t1 of the substrate 10. Since the width of the channel layer is increased due to the design, so that a driving current and an operating speed of the first transistor T1 are increased. In addition, since the side surface 10s of the substrate 10 has the recess 10D, the first gate 230 may control the channel layer more easily.

The second insulation structure 310 is located in the second region R2 and is disposed in the substrate 10. In the present embodiment, the second insulation structure 310 is a shallow trench isolation structure. In addition, in the present embodiment, the top surface of the second insulation structure 310 is higher than the top surface 10t2 of the substrate 10.

The second gate dielectric layer 320 is located in the second region R2 and covers the substrate 10. In detail, the second gate dielectric layer 320 is formed on the top surface 10t2 of the substrate 10.

The second gate 330 is located in the second region R2, disposed on the substrate 10, and covers the second gate dielectric layer 320. In addition, in addition to the second gate dielectric layer 320, the second gate 330 further covers the second insulation structure 310.

In some embodiments, opposite sides of the second gate 330 may be provided with a second source region (not shown) and a second drain region (not shown), respectively. The second gate dielectric layer 320, the second gate 330, a portion of the substrate 10 (a channel layer), the second source region, and the second drain region may form a second transistor T2 of the present embodiment A main difference between the second transistor T2 and the first transistor T1 is that the second transistor T2 does not control the channel layer on three sides. Therefore, the threshold voltage of the second transistor T2 is higher than the threshold voltage of the first transistor T1, which may further prevent a leakage current of the second transistor T2 from being generated.

Based on the above, the second region (a periphery circuit region) of the memory device of the invention includes both a metal-oxide semiconductor device (a first transistor) with a low threshold voltage and a metal-oxide semiconductor device (a second transistor) with a high threshold voltage. The side surface of the substrate is exposed through causing the top surface of the first insulation structure located in the second region (the periphery circuit region) to be lower than the top surface of the substrate. Therefore, the first gate formed on the substrate could cover the top surface of the substrate and the side surface of the substrate, so that the first gate may control the channel layer on three sides to reduce the threshold voltage, and the leakage current of the first transistor may be accordingly prevented from being generated. In addition, a width of the channel layer is also increased due to the design, so that a driving current and an operating speed of the first transistor are also increased.

Furthermore, according to the method for manufacturing the memory device of the invention, a fewer mask may be used to form both the metal-oxide semiconductor device (the first transistor) with a low threshold voltage and the metal-oxide semiconductor device (the second transistor) with a high threshold voltage, so that manufacturing costs may be reduced.

What is claimed is:

1. A memory device, comprising:
a substrate comprising a first region and a second region, wherein the second region is adjacent to the first region;
a stack structure located in the first region and disposed on the substrate, wherein the stack structure comprises a gate dielectric layer and a floating gate, and the tunnel dielectric layer is located between the floating gate and the substrate;
an isolation structure located in the first region and disposed in the substrate and at two sides of the stack structure;
an inter-gate dielectric layer located in the first region and covering the stack structure and the isolation structure;
a control gate located in the first region and covering the inter-gate dielectric layer;
a first insulation structure located in the second region and disposed in the substrate, wherein a top surface of the first insulation structure is lower than a top surface of the substrate, and a side surface of a portion of the substrate is exposed;
a first gate dielectric layer located in the second region and disposed only on the top and the side surfaces of the substrate and terminating on the top surface of the first insulation structure; and
a first gate located in the second region and covering the first gate dielectric layer.

2. The memory device according to claim 1, wherein a top surface of the isolation structure is lower than a top surface of the stack structure.

3. The memory device according to claim 1, wherein the inter-gate dielectric layer comprises a composite layer comprising a silicon oxide layer and a silicon nitride layer.

4. The memory device according to claim 1, wherein the first gate dielectric layer located on a recess of the side surface of the substrate in the second region.

5. The memory device according to claim 1, wherein a material of the control gate and a material of the first gate comprise polycrystalline silicon, or metal.

6. The memory device according to claim 1, wherein a material of the first gate dielectric layer comprises SiO2, HfO2, or ZrO2.

7. The memory device according to claim 1, further comprising:
a second gate dielectric layer located in the second region and disposed on the substrate, wherein a top surface of the second gate dielectric layer is lower than a top surface of the inter-gate dielectric layer; and
a second gate located in the second region and covering the second gate dielectric layer.

8. The memory device according to claim 7, wherein a top surface of a second insulation structure adjacent to the second gate is higher than the top surface of the substrate.

9. A memory device, comprising:
a substrate comprising a first region and a second region, wherein the second region is located adjacent to the first region;
a stack structure located in the first region and disposed on the substrate, wherein the stack structure comprises a gate dielectric layer and a floating gate, and the gate dielectric layer is located between the floating gate and the substrate;
an isolation structure located in the first region and disposed in the substrate and at two sides of the stack structure, wherein a top surface of the isolation structure is lower than a top surface of the stack structure;
an inter-gate dielectric layer located in the first region and covering the stack structure and the isolation structure;
a control gate located in the first region and covering the inter-gate dielectric layer;
a first insulation structure located in the second region and disposed in the substrate, wherein a top surface of the first insulation structure is lower than a top surface of the substrate, a portion of a side surface of the substrate has a recess above the top surface of the first insulation structure;
a first gate dielectric layer located in the second region and disposed only on the top surface of the substrate and the recess of the substrate, and terminating on the top surface of the first insulation structure; and
a first gate located in the second region and covering the first gate dielectric layer.

* * * * *